United States Patent
Mitlmeier et al.

(10) Patent No.: US 6,813,132 B1
(45) Date of Patent: Nov. 2, 2004

(54) CONTROL SYSTEM FOR AN ELECTROMAGNETIC SWITCHING DEVICE AND ELECTROMAGNETIC SWITCHING DEVICE CORRESPONDING THERETO

(75) Inventors: Norbert Mitlmeier, Ursensollen (DE); Bernhard Streich, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 372 days.

(21) Appl. No.: 10/088,166

(22) PCT Filed: Jul. 31, 2000

(86) PCT No.: PCT/DE00/02522

§ 371 (c)(1),
(2), (4) Date: Mar. 15, 2002

(87) PCT Pub. No.: WO01/20630

PCT Pub. Date: Mar. 22, 2001

(30) Foreign Application Priority Data

Sep. 16, 1999 (DE) .......................... 199 44 461

(51) Int. Cl.⁷ .............................................. H01H 47/00
(52) U.S. Cl. ..................................................... 361/160
(58) Field of Search ................................ 361/160, 166, 361/170, 188, 139; 324/763, 514

(56) References Cited

U.S. PATENT DOCUMENTS 3,560,664 A * 2/1971 Stich ........................... 379/270
5,455,733 A * 10/1995 Waggamon .................. 361/115
5,539,608 A * 7/1996 Hurley et al. ................ 361/152

FOREIGN PATENT DOCUMENTS

| DE | 1 590 602 | 4/1970 |
| DE | 44 06 250 A1 | 9/1994 |
| DE | 196 32 347 A1 | 2/1998 |
| EP | 0 660 348 A1 | 6/1995 |
| WO | WO 98/38661 | 9/1998 |

* cited by examiner

Primary Examiner—Brian Sircus
Assistant Examiner—Z Kitov
(74) Attorney, Agent, or Firm—Harness, Dickey & Pierce P.L.C.

(57) ABSTRACT

An electromagnetic switching device is monitored at least for the correct connection of an input contact and of an output contact by a contact bridge. For this purpose, a monitoring circuit is coupled to the contacts before the contact bridge is moved into a connection position when a connection command is given, and an indicator of the correct connection of the contacts is determined by evaluation of a contact voltage dropped across the contacts and supplied to the monitoring circuit.

37 Claims, 2 Drawing Sheets

CONTROL SYSTEM FOR AN ELECTROMAGNETIC SWITCHING DEVICE AND ELECTROMAGNETIC SWITCHING DEVICE CORRESPONDING THERETO

This application is the national phase under 35U.S.C. § 371 of PCT International application No. PCT/DE00/02522 which has an International filing date of Jul. 31, 2000, which designated the United States of America, the entire contents of which are hereby incorporated by reference.

FIELD OF THE INVENTION

The present invention generally relates to a method and system for monitoring an electromagnetic switching device, and to an electromagnetic switching device itself. More particularly, it can include a method at least for the correct connection of an input contact and of an output contact using a contact bridge. The contact bridge can be moved from a separated position into a connection position using a bridge drive when a connection command is given, if the contacts are correctly connected. The electromagnetic switching device can include circuit breakers, relays, etc.

BACKGROUND OF THE INVENTION

Electromagnetic switching devices, including circuit breakers and relays, are generally known. They exhibit at least one input contact and one output contact which are connected to one another or separated from one another via a contact bridge. Apart from normal wear, two types of disturbances can essentially occur. One disturbance is the breaking of the contact bridge. In this case, the contacts can no longer be correctly connected to one another. The other disturbance is that the contact bridge becomes welded to the contacts. In this case, the contacts can no longer be correctly separated from one another. A broken bridge, in particular, can lead to the destruction of the entire electromagnetic switching device and also to disturbances in a connected installation.

Naturally, it is possible to check the electromagnetic switching device for correct functioning in a test circuit. However, this test is done in a test circuit. Continuous monitoring of the electromagnetic switching device during its operation is not possible by this means.

SUMMARY OF THE INVENTION

An object of an embodiment of the present invention includes creating a monitoring method for an electromagnetic switching device (including circuit breakers, relays, etc.) and an electromagnetic switching device corresponding thereto, via which the electromagnetic switching device can be monitored at least for a correct connection of the contacts in continuous operation.

An object can be achieved for the monitoring method in that when the connection command is given, a monitoring circuit is coupled to the contacts before the contact bridge is moved into the connection position. An indicator of the correct connection of the contacts can be determined by evaluating a contact voltage which is dropped across the contacts and which is supplied to the monitoring circuit.

Correspondingly, an object with respect to the electromagnetic switching device can be achieved in that a monitoring circuit can be coupled to the contacts via an auxiliary switch, the auxiliary switch can be constructed in such a manner that when a connection command is given, the auxiliary switch is closed-before the contact bridge is moved into the connection position, and the monitoring circuit can deliver an indicator of the correct connection of the contacts.

If the contact bridge is moved from the connection position into the separated position using the bridge drive when a separating command is given when the contacts are correctly separated, the monitoring circuit is decoupled from at least one of the contacts after the contact bridge has been moved into the separated position when a separating command is given. An indicator of the correct separation of the contacts can then be determined by evaluation of the contact voltage. The electromagnetic switching device can also be monitored for correct separation of the input contact from the output contact by the contact bridge.

If the contact voltage is rectified before it is supplied to the monitoring circuit, the monitoring circuit can be used independently of the type and possibly polarization of the switched voltage.

If a preliminary signal corresponding to the contact voltage is supplied to an evaluating unit which determines the indicator, the determination of the indicator can be particularly simple.

If the preliminary signal is supplied to the evaluating unit in a DC-isolated manner, the evaluating unit can be incorporated in a particularly simple manner into a higher-level controller and/or the circuit breaker controller. In particular, it is possible to move the electromagnetic switching device into a safe state if the contacts are incorrectly connected or separated, respectively. As an alternative or additionally, it is possible to signal the incorrect connection or separation of the contacts to a higher-level controller if the contacts are not correctly connected or separated, respectively.

BRIEF DESCRIPTION OF THE DRAWINGS

Further advantages and details can be obtained from the subsequent description of an exemplary embodiment. In a basic representation.

DETAILED DESCRIPTION OF THE PREFERRED EMBODIMENTS

Figure 1:
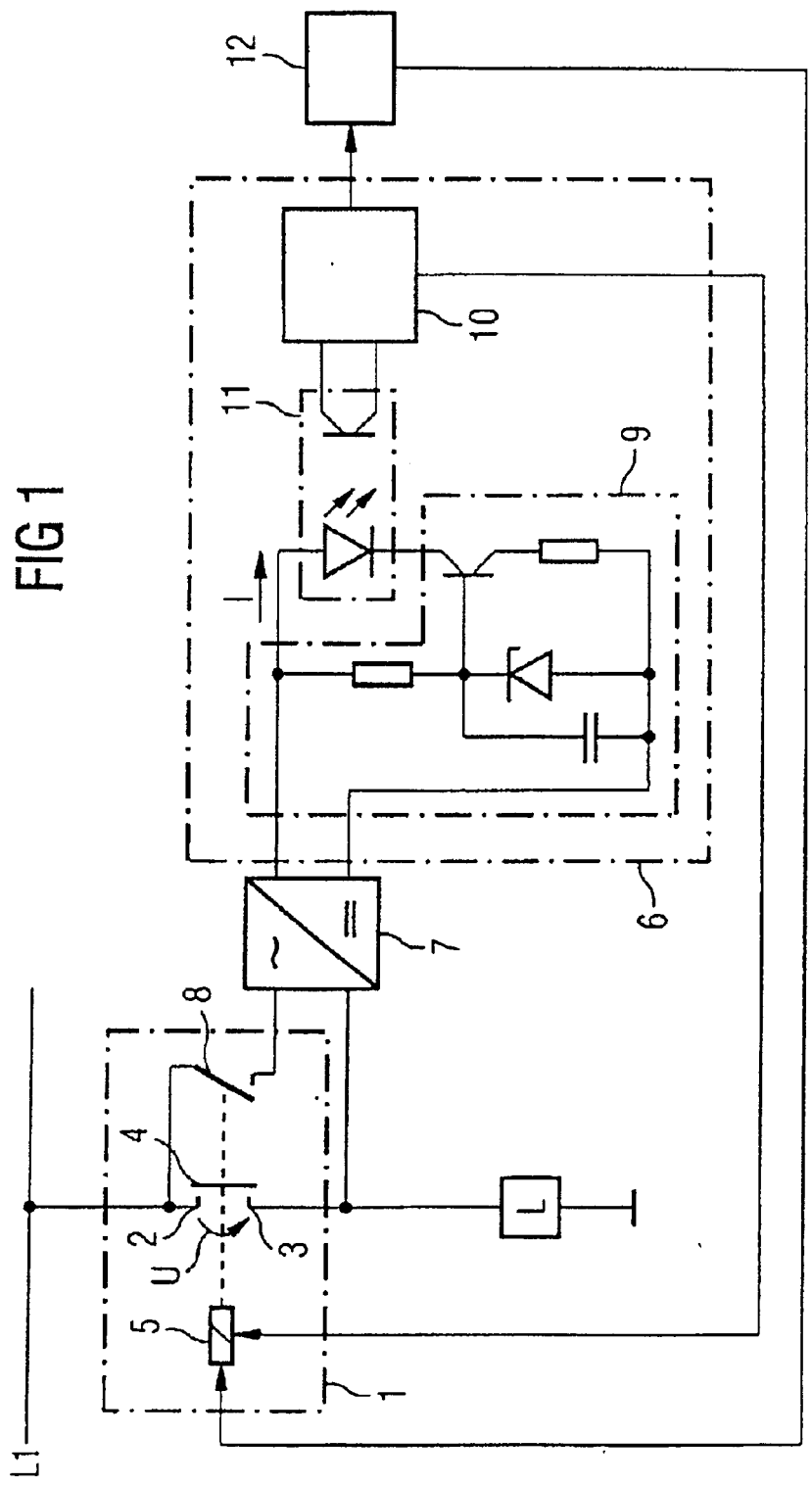
FIG. 1 shows an electromagnetic switching device with a monitoring circuit and FIGS. 2-4 in each case show a switching diagram of the electromagnetic switching device and a variation of the preliminary signal.

According to an embodiment of FIG. 1, an electromagnetic switching device 1 is constructed as circuit breaker. It exhibits at least one input contact 2 and an output contact 3 corresponding thereto and a contact bridge 4. If the electromagnetic switching device 1 is operating correctly, the contact bridge 4 is moved from a separated position into a connection position when a connection command is given. When a separating command is given, the contact bridge 4 is moved from the connection position into the separated position. In the connection position of the contact bridge 4, the contacts 2, 3 are connected to one another. In the separated position, they are separated from one another. The contact bridge 4 is moved from the separated position into the connection position and conversely using a bridge drive 5.

To monitor the electromagnetic switching device 1 for correct connection and separation of the contacts 2, 3 the electromagnetic switching device 1 exhibits a monitoring circuit 6. The monitoring circuit 6 is preceded by a rectifier 7. The rectifier 7, in turn, is preceded by an auxiliary switch 8. The monitoring circuit 6 can be coupled to the contacts 2, 3 and decoupled from the input contact 2 via the auxiliary switch 8. When the auxiliary switch 8 is closed, the monitoring circuit 6 is supplied with a contact voltage U which is dropped across the contacts 2, 3. Due to the presence of the rectifier 7, the contact voltage U is supplied rectified to the monitoring circuit 6.

The auxiliary switch 8 is constructed in such a manner that it leads when the contact bridge 4 is moved into the connection position and lags when the contact bridge 4 is moved into the separated position. When a connection command is given, the auxiliary switch 8 is thus closed before the contact bridge 4 is moved into the connection position. When a separating command is given, on the other hand, the auxiliary switch 8 is only opened after the contact bridge 4 has been moved into the separated position. When the connection command is given, the monitoring circuit 6 is thus coupled to the contacts 2, 3 before the contact bridge 4 is moved into the connection position. When a separating command is given, it is only decoupled from the input contact 2 after the contact bridge 4 has been moved into the separated position. This makes it possible for the monitoring circuit 6, by evaluating the contact voltage U supplied to it, to determine an indicator of the correct connection and separation, respectively, of the contacts 2, 3. The indicator can then be output by the monitoring circuit 6.

Due to the rectification of the contact voltage U, the construction of the monitoring circuit 6 can be independent of the polarization of the voltage to be switched and can also be independent of whether the voltage to be switched is a direct voltage or an alternating voltage.

According to an embodiment of FIG. 1, the monitoring circuit 6 can include a contact voltage indicator 9 and an evaluating unit 10. The contact voltage indicator 9 is constructed as a constant current source according to an embodiment of FIG. 1. When a contact voltage U is present, the contact voltage indicator 9 thus outputs a constant current 1 independently of the magnitude of the voltage. The constant current 1 thus represents a preliminary signal corresponding to the contact voltage U.

The preliminary signal is supplied to the evaluating unit 10 DC-isolated via an optocoupler 12. The evaluating unit 10 then determines the indicator for the separation or connection, respectively, of the contacts 2, 3.

It is possible that the evaluating unit 10 only indicates the presence or absence of correct operation of the switching device 1 via an indicator, e.g. a light-emitting diode. In this case, manual intervention by an operating person must take place if the switching device 1 is not correctly operating. However, the evaluating unit 10 is preferably connected to the bridge drive 5 by control technology. In this case, it is possible for the electromagnetic switching device 1 to be moved into a safe state if the contacts 2, 3 are not correctly connected or separated.

As an alternative or additionally, the evaluating unit 10 can also be communicatively connected to a higher-level controller 12.

In this case, a corresponding message can be conveyed to the higher-level controller 12 if the contacts 2, 3 are not correctly connected or separated.

Figure 2:
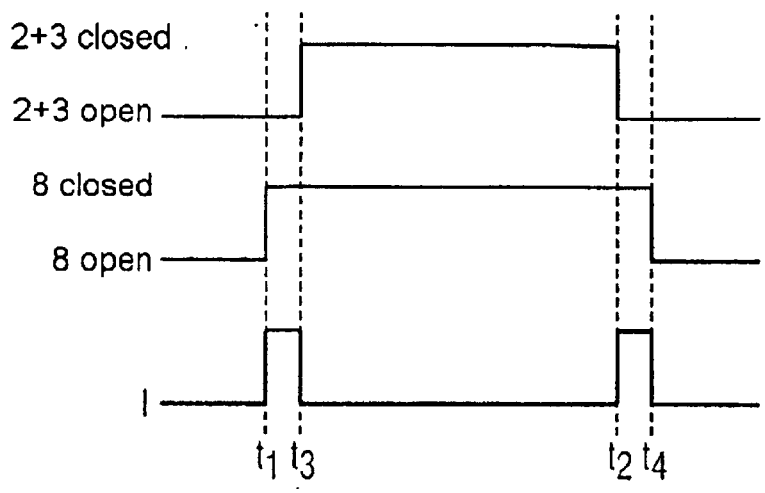
Figure 3:
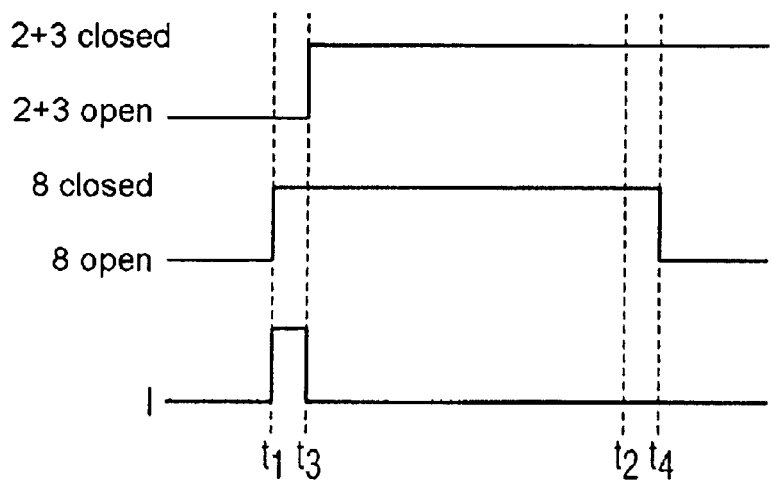
Figure 4:
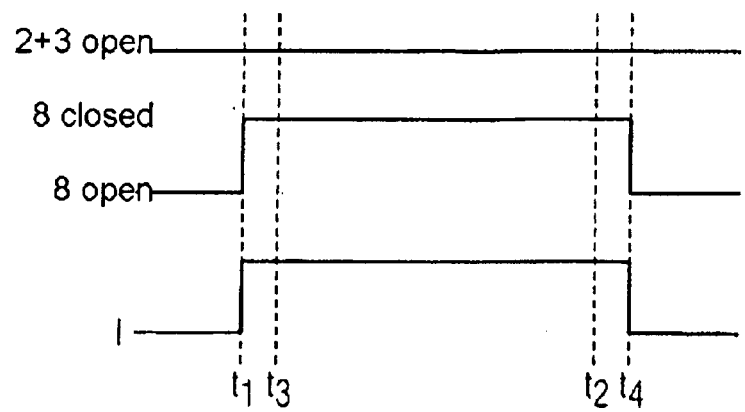

FIGS. 2 to 4 show embodiments illustrating how the preliminary signal conveyed from the optocoupler 11 to the evaluating unit 10, can be evaluated.

According to the embodiments of FIGS. 2 to 4, a connection command is given to the electromagnetic switching device 1 at a time t1 and a separating command is given at a time t2. As the connection command is given, the auxiliary switch 8 is closed at the same time or directly thereafter. The contacts 2, 3, on the other hand, are only closed later, namely at a time t3, if they are operating correctly according to the embodiments of FIGS. 2 and 3. According to FIGS. 2 and 3, a preliminary signal is output via the optocoupler 11 between times t1 and t3 and is no longer given thereafter. If, on the other hand, as shown in the embodiment of FIG. 4, the contact bridge 4 is broken or the contacts 2, 3 are not connected to one another for other reasons, the optocoupler 11 transmits a continuous signal from time t1 onward. The occurrence of a continuous signal can thus be used as indicator of a broken contact bridge 4.

After the separating command has been given, the contacts 2, 3 are immediately separated from one another again but the auxiliary switch 8 is only separated at a time t4. When the switching device 1 is operating correctly according to the embodiment of FIG. 2, a preliminary signal is again conveyed to the evaluating unit 10 between times t3 and t4.

If, on the other hand, as shown in the embodiment of FIG. 3, the contact bridge 4 is welded to the contacts 2, 3, the second pulse is missing. The lack of the second pulse can be used as indicator of nonseparation of the contacts 2, 3. Naturally, after the auxiliary switch 8 has opened, the preliminary signal also goes back down to zero if the contacts 2, 3 are separated from one another.

The switching device 1 described above and the monitoring method corresponding thereto can be used not only with single phase direct-voltage and alternating-voltage systems but also with multi-phase three-phase systems. In this case, a separate auxiliary switch 8 and a separate contact voltage indicator 9 are required for each pair of an input and output contact 2, 3 which can be connected to one another via a contact bridge 4. The evaluating unit 10 can be optionally separate or common to all phases.

In the case of a star connection with separate neutral conductor, unrestricted monitoring of the switched contacts 2, 3 is possible. In the case of a delta connection, unrestricted monitoring of the switched contacts 2, 3 for correct connection is possible. Nonseparation of one of three contacts cannot be detected, nonseparation of two or three contact pairs, on the other hand, can also be detected in the case of a delta connection.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for monitoring an electromagnetic switching device at least for the correct connection of an input contact and of an output contact via a contact bridge, the contact bridge being moved from a separated position into a connection position via a bridge drive when a connection command is given and upon determining that the contacts are correctly connected comprising:

coupling, when the connection command is given, a monitoring circuit to the contacts before the contact bridge is moved into the connection position; and determining an indicator of the correct connection of the contacts by evaluation of a contact voltage dropped across the contacts and supplied to the monitoring circuit.

2. The monitoring method as claimed in claim 1, wherein the electromagnetic switching device is also monitored for correct separation of the input contact from the output contact by the contact bridge, further comprising:

moving, if the contacts are correctly separated, the contact bridge from the connection position into the separated position via the bridge drive, when a separating command is given;

decoupling, when a separating command is given, the monitoring circuit from at least one of the contacts after the contact bridge has moved into the separated position; and determining an indicator of the correct separation of the contacts by evaluation of the contact voltage.

3. The monitoring method as claimed in claim 1, further comprising:

rectifying the contact voltage before it is supplied to the monitoring circuit.

4. The monitoring method as claimed in claim 1, wherein a preliminary signal, corresponding to the contact voltage, is supplied to an evaluating unit to aid in determining the indicator.

5. The monitoring method as claimed in claim 4, wherein the preliminary signal is supplied DC-isolated to the evaluating unit.

6. The monitoring method as claimed in claim 1, wherein the electromagnetic switching device is moved into a safe state if the contacts are not correctly connected or separated, respectively.

7. The monitoring method as claimed in claim 6, wherein the incorrect connection or separation of the contacts is signaled to a higher-level controller if the contacts are not correctly connected or separated, respectively.

8. An electromagnetic switching device, comprising:
at least one input contact;
at least one output contact;
a contact bridge; and
a bridge drive for moving the contact bridge from a separated position to a connection position when a connection command is given, wherein a monitoring circuit is coupleable to the contacts via an auxiliary switch, wherein when a connection command is given, the auxiliary switch is closed before the contact bridge is moved into the connection position, and wherein the monitoring circuit outputs an indicator of the correct connection of the contacts.

9. The switching device as claimed in claim 8, wherein the monitoring circuit is decoupleable from at least one of the contacts via the auxiliary switch, wherein when a separating command is given, the auxiliary switch is opened after the contact bridge has been moved into the separated position, and wherein the monitoring circuit outputs an indicator of the correct separation of the contacts.

10. The switching device as claimed in claim 8, wherein the monitoring circuit is preceded by a rectifier.

11. The switching device as claimed in claim 8, wherein the monitoring circuit includes a contact voltage indicator and an evaluating unit, wherein the contact voltage indicator outputs to the evaluating unit a preliminary signal corresponding to a contact voltage and wherein the evaluating unit uses the preliminary signal to aid in determining the indicator.

12. The switching device as claimed in claim 11, wherein the contact voltage indicator is DC-isolated from the evaluating unit.

13. The switching device as claimed in claim 9, wherein the monitoring circuit is connected to the bridge drive by control technology.

14. The switching device as claimed in claim 8, wherein the monitoring circuit is communicatively connected to a higher-level controller.

15. The monitoring method as claimed in claim 2, further comprising:

rectifying the contact voltage before it is supplied to the monitoring circuit.

16. The monitoring method as claimed in claim 2, wherein a preliminary signal, corresponding to the contact voltage, is supplied to an evaluating unit to aid in determining the indicator.

17. The monitoring method as claimed in claim 16, wherein the preliminary signal is supplied DC-isolated to the evaluating unit.

18. The monitoring method as claimed in claim 2, wherein the electromagnetic switching device is moved into a safe state if the contacts are not correctly connected or separated, respectively.

19. The monitoring method as claimed in claim 18, wherein the incorrect connection or separation of the contacts is signaled to a higher-level controller if the contacts are not correctly connected or separated, respectively.

20. The switching device as claimed in claim 9, wherein the monitoring circuit is preceded by a rectifier.

21. The switching device as claimed in claim 9, wherein the monitoring circuit includes a contact voltage indicator and an evaluating unit, wherein the contact voltage indicator outputs to the evaluating unit a preliminary signal corresponding to a contact voltage and wherein the evaluating unit uses the preliminary signal to aid in determining the indicator.

22. The switching device as claimed in claim 21, wherein the contact voltage indicator is DC-isolated from the evaluating unit.

23. The switching device as claimed in claim 8, wherein the monitoring circuit is connected to the bridge drive by control technology.

24. The switching device as claimed in claim 9, wherein the monitoring circuit is communicatively connected to a higher-level controller.

25. The method of claim 1, wherein the electromagnetic switching device is a circuit breaker.

26. The method of claim 2, wherein the electromagnetic switching device is a circuit breaker.

27. The device of claim 8, wherein the electromagnetic switching device is a circuit breaker.

28. The device of claim 9, wherein the electromagnetic switching device is a circuit breaker.

29. The device of claim 8, wherein the electromagnetic switching device includes the auxiliary switch.

30. The device of claim 9, wherein the electromagnetic switching device includes the auxiliary switch.

31. A monitoring circuit, coupleable to input and output contacts of an electromagnetic switching device, comprising:

a contact voltage indicator; and
an evaluating unit, wherein the monitoring circuit is coupleable to the contacts when a connection command is given and before a contact bridge of the electromagnetic switching device is moved from a separated position to a connection position, wherein the contact voltage indicator outputs a preliminary signal to the evaluation unit corresponding to a contact voltage, and wherein the evaluation unit uses the preliminary signal to aid in determining an indicator of correct connection of the contacts, such that the contact bridge is moved from a separated position to a connection position upon determining that the contacts are correctly connected.

32. The monitoring circuit of claim 31, wherein the monitoring circuit is coupleable to the contacts via an auxiliary switch.

33. The monitoring circuit as claimed in claim 32, wherein the monitoring circuit is decoupleable from at least one of the contacts via the auxiliary switch, wherein when a separating command is given, the auxiliary switch is opened after the contact bridge has been moved into the separated position, and wherein the monitoring circuit outputs an indicator of the correct separation of the contacts.

34. The monitoring circuit as claimed in claim 33, wherein the monitoring circuit is preceded by a rectifier.

35. The monitoring circuit as claimed in claim 31, wherein the contact voltage indicator is DC-isolated from the evaluating unit.

36. The monitoring circuit of claim 31, wherein a bridge drive moves the contact bridge and wherein the monitoring circuit is connected to the bridge drive by control technology.

37. The monitoring circuit of claim 31, wherein a bridge drive moves the contact bridge and wherein the monitoring circuit is communicatively connected to a higher-level controller.

\* \* \* \* \*